(12) United States Patent
Yamada et al.

(10) Patent No.: US 8,995,179 B2
(45) Date of Patent: Mar. 31, 2015

(54) MAGNETORESISTANCE ELEMENT AND NON-VOLATILE SEMICONDUCTOR STORAGE DEVICE USING SAME MAGNETORESISTANCE ELEMENT

(75) Inventors: Michiya Yamada, Hino (JP); Yasushi Ogimoto, Higashiyamato (JP)

(73) Assignee: Fuji Electric Co., Ltd., Kawasaki-shi (JP)

( * ) Notice: Subject to any disclaimer, the term of this patent is extended or adjusted under 35 U.S.C. 154(b) by 435 days.

(21) Appl. No.: 13/395,437

(22) PCT Filed: Aug. 4, 2010

(86) PCT No.: PCT/JP2010/063152
§ 371 (c)(1),
(2), (4) Date: May 17, 2012

(87) PCT Pub. No.: WO2011/033873
PCT Pub. Date: Mar. 24, 2011

(65) Prior Publication Data
US 2012/0230089 A1    Sep. 13, 2012

(30) Foreign Application Priority Data

Sep. 17, 2009  (JP) .................................. 2009-215561

(51) Int. Cl.
*G11C 11/00* (2006.01)
*G11C 5/08* (2006.01)
(Continued)

(52) U.S. Cl.
CPC .............. *H01L 27/228* (2013.01); *G11C 11/16* (2013.01); *H01L 27/224* (2013.01); *H01L 43/08* (2013.01)
USPC ........................... 365/158; 365/171; 365/173

(58) Field of Classification Search
CPC ...... G11C 11/16; G11C 11/15; G11C 7/1075; H01L 43/08; H01L 27/224; H01L 27/228; H01L 27/22; H01L 43/10; H01L 27/226
USPC .................. 365/158, 171, 173; 257/E21.665, 257/E29.323, 295, 421
See application file for complete search history.

(56) References Cited

U.S. PATENT DOCUMENTS

2004/0095801 A1   5/2004   Stipe
2004/0105305 A1   6/2004   Hayakawa
(Continued)

FOREIGN PATENT DOCUMENTS

JP    2004-172614 A    6/2004
JP    2004-179483 A    6/2004
(Continued)

OTHER PUBLICATIONS

David Djayaprawira et al., "230% room-temperature magnetoresistance in CoFeB/MgO/CoFeB magnetic tunnel junctions", Applied physics letters 86, 092502, Feb. 23, 2005.
(Continued)

*Primary Examiner* — Hien Nguyen
(74) *Attorney, Agent, or Firm* — Rabin & Berdo, P.C.

(57) ABSTRACT

A magnetoresistance element is disclosed. The magnetoresistance element includes a magnetic tunnel junction portion configured by sequentially stacking a perpendicularly magnetized first magnetic body, an insulation layer, and a perpendicularly magnetized second magnetic body. The second magnetic body has a configuration wherein a ferromagnetic layer and a rare earth-transition metal alloy layer are stacked sequentially from the insulation layer side interface. A heat assist layer that heats the second magnetic body with a heat generated based on a current flowing through the magnetic tunnel junction portion is further provided.

11 Claims, 20 Drawing Sheets

(51) Int. Cl.
  *H01L 27/22* (2006.01)
  *G11C 11/16* (2006.01)
  *H01L 43/08* (2006.01)

(56) References Cited

U.S. PATENT DOCUMENTS

| | | |
|---|---|---|
| 2004/0179483 A1 | 9/2004 | Perlow et al. |
| 2005/0078510 A1 | 4/2005 | Jeong et al. |
| 2006/0092696 A1 | 5/2006 | Bessho |
| 2007/0297220 A1 | 12/2007 | Yoshikawa et al. |
| 2008/0225577 A1 | 9/2008 | Hosotani |
| 2010/0188893 A1* | 7/2010 | Zhou .................... 365/171 |
| 2010/0284217 A1 | 11/2010 | Ogimoto et al. |
| 2011/0063899 A1 | 3/2011 | Ogimoto |
| 2011/0170339 A1* | 7/2011 | Wunderlich et al. .......... 365/158 |

FOREIGN PATENT DOCUMENTS

| | | |
|---|---|---|
| JP | 2005-109470 A | 4/2005 |
| JP | 2006-080241 A | 3/2006 |
| JP | 2006-080385 A | 3/2006 |
| JP | 2006-128579 A | 5/2006 |
| JP | 2008-004952 A | 1/2008 |
| JP | 2008-028362 A | 2/2008 |
| WO | WO-2009/078202 A1 | 6/2009 |
| WO | WO-2009-098796 A1 | 8/2009 |

OTHER PUBLICATIONS

Jun Hayakawa et al., "Current-Induced Magnetization Switching in MgO Barrier Based Magnetic Tunnel Junctions with CoFeB/Ru/CoFeB Synthetic Ferrimagnetic Free Layer", Japanese Journal of Applied Physics, vol. 45, No. 40, pp. L1057-L1060, Oct. 6, 2006.

D. H. Lee et al., "Increase of temperature due to Joule heating during current-induced magnetization switching of an MgO-based magnetic tunnel junction", Applied Physics letters, 92, 233502, Jun. 9, 2008.

European Patent Office, Supplementary Partial European Search Report, in Application No. EP 10816986, dated Nov. 28, 2014 (4 pages).

* cited by examiner

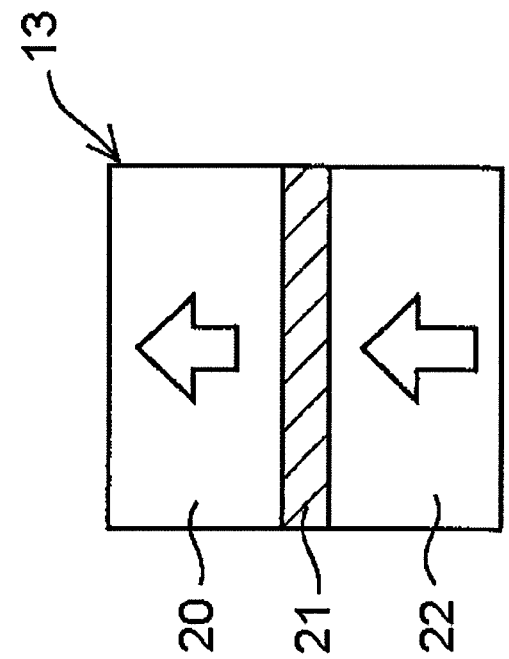
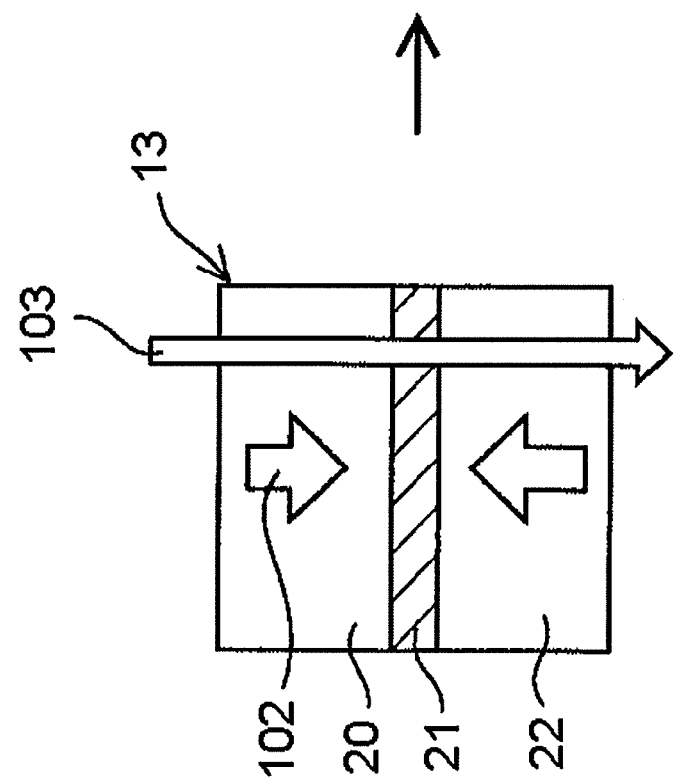
FIG. 12B
FIG. 12A

MAGNETORESISTANCE ELEMENT AND NON-VOLATILE SEMICONDUCTOR STORAGE DEVICE USING SAME MAGNETORESISTANCE ELEMENT

This application is the national phase of international application number PCT/JP2010/63152, filed Aug. 4, 2010, and claims the benefit of priority of Japanese patent application JP PA 2009-215561, filed Sep. 17, 2009. The disclosures of the international application and the Japanese priority applications are incorporated herein by reference.

TECHNICAL FIELD

The present invention relates to a magnetoresistance element forming a central portion of a magnetic memory (MRAM), and to a non-volatile semiconductor storage device using the magnetoresistance element.

BACKGROUND ART

In recent years, there has been a noticeable increase in capacity of non-volatile semiconductor storage devices typified by flash memories, going as far as the release of products having a capacity of several hundred gigabytes being announced. The product value of the non-volatile semiconductor storage device is increasing, in particular as storage for USB memories and mobile telephones. Also, the non-volatile semiconductor storage device utilizes the fundamental advantages peculiar to a solid state memory—vibration resistance, high reliability, and low power consumption—and is becoming mainstream as a storage device for mobile type or portable type electronic instruments for music and images.

Meanwhile, apart from the heretofore described storage-oriented application, research is being vigorously carried out aimed at, by giving non-volatility to a DRAM currently being used as a main memory of an information instrument, realizing a computer, a so-called "instant-on computer", that starts up instantly when used and whose power consumption is unrestrictedly zero when waiting. In order to realize this, a memory that satisfies requirements of (1) a switching speed less than 50 ns and (2) a rewrite quantity exceeding $10^{16}$ which are technical specifications required as a DRAM, and that includes non-volatility, is said to be appropriate.

As candidates for this kind of next generation non-volatile semiconductor storage device, research and development is being carried out on non-volatile memory elements based on various kinds of principle, such as a ferroelectric memory (FeRAM), a magnetic memory (MRAM), and a phase-change memory (PRAM). Even among these kinds of non-volatile memory, the MRAM is seen as being promising as a candidate that satisfies the heretofore described technical specifications for replacing the DRAM. The rewrite quantity ($>10^{16}$) cited in the heretofore described technical specifications is a figure assumed based on an access quantity when continuing to access at 30 ns for 10 years. However, as no refresh cycle is appropriate when the memory is non-volatile, it may be that such a large quantity is not appropriate. The MRAM is at the prototype level but, as it has achieved a rewrite quantity of $10^{12}$ or more and the switching speed thereof is high (<10 ns), feasibility is seen as being particularly high in comparison with technologies forming other candidates as a non-volatile semiconductor storage device.

Problems with the MRAM are that the cell area is large and that the write energy is large. As the currently commercialized small capacity (in the region of 4 Mbit) MRAM is a current produced magnetic field rewrite type, the cell area thereof is far too large at 20 to 30 $F^2$ (F is the minimum processing dimension in the manufacturing process) or more, because of which, it is not practical as DRAM replacement means. In response to this, two breakthrough technologies are in the process of changing the situation. One is an MTJ (magnetic tunnel junction) using an MgO tunnel insulation film, and according to the MTJ, a magnetoresistance of 200% or more is easily obtained (for example, refer to Non-patent Document 1). The other is a spin torque transfer method (hereafter abbreviated to STT method). According to the STT method, as it is possible to avoid an increase of reversed magnetic fields in minute cells, which is fatal with the current produced magnetic field rewrite method, it is possible to reduce write energy due to scaling. According to the STT method, as one transistor to one MTJ is ideally possible, it is assumed that the cell area is equivalent to that of the DRAM (6 to 8 $F^2$) (for example, refer to Patent Document 1, Non-patent Document 2).

Herein, a simple description will be given, using FIG. 11, of an action of the heretofore described heretofore known MRAM. FIG. 11 is an enlarged sectional view of a storage device 10' showing a portion including a magnetoresistance element 1'. The storage device 10' shown in FIG. 11 carries out an action equivalent to that described in Patent Document 1.

The magnetoresistance element 1' has a magnetic tunnel junction (MTJ) portion 13, and is configured in such away that the MTJ portion 13 is sandwiched by a lower electrode 14 and an upper electrode 12. The MTJ portion 13 is of a structure wherein a pinned layer 22 (a first magnetic body), an insulation layer 21, a storage layer 20 (a second magnetic body), and the upper electrode 12 are stacked sequentially from below (the lower electrode 14 side). The pinned layer 22 and storage layer 20 are formed of perpendicularly magnetized films. The lower electrode 14 is disposed on a drain region 24 formed in a silicon substrate 15, and furthermore, a source region 25 is formed in the silicon substrate 15 at a distance from the drain region 24. A gate line 16 is formed in a portion above the drain region 24 and source region 25, isolated from them, and a MOS-FET is configured of the drain region 24, source region 25, and gate line 16. Furthermore, a contact portion 17 and a word portion 18 are stacked sequentially on the source region 25, and the word line 18 is connected to an unshown control circuit. Also, the upper electrode 12 is connected to a bit line 11, and the bit line 11 is also connected to the unshown control circuit. The bit line 11 and word line 18 are isolated from each other by an interlayer insulation film 23.

Next, a description will be given, using FIG. 12, of an operating principle of the heretofore known magnetoresistance element 1'. FIG. 12 is an enlarged view of the MTJ portion 13 in FIG. 11.

In the magnetoresistance element 1' configured as in FIG. 12, the resistance value changes in accordance with a relative magnetization direction of the storage layer 20 with respect to the pinned layer 22 (a TMR effect). Specifically, when the magnetization direction of the storage layer 20 is a direction opposite to that of the pinned layer 22 (the condition of FIG. 12(a)), the insulation layer 21 is in a high resistance condition, while when the magnetization direction of the storage layer 20 is the same direction as that of the pinned layer 22 (the condition of FIG. 12(b)), the insulation layer 21 is in a low resistance condition. Utilizing this, a high resistance condition is caused to correspond to "0" and a low resistance condition to "1", and the magnetization condition (data) of the storage layer 20 is read as a resistance value. This is the read principle.

With regard to a write, by causing a current 103 oriented from the storage layer 20 toward the pinned layer 22 to flow, as in FIG. 12, the storage layer 20 changes from a high resistance condition to a low resistance condition. Also, by causing an oppositely oriented current to flow through the storage layer 20 when it is in a low resistance condition, the layer 20 changes from a low resistance condition to a high resistance condition. This is the write principle (refer to Non-patent Document 2). In the way heretofore described, the storage device 10' selects the magnetoresistance element 1' using a corresponding MOS-FET, reads information stored in the magnetoresistance element 1', and writes information into the magnetoresistance element 1'.

Meanwhile, there is also a proposal for one diode to one MTJ, aiming at a small cell area (up to 4 $F^2$) equivalent to that of a flash memory (for example, refer to Patent Document 2). Furthermore, there is also a proposal whereby, in an element provided with a drive layer whose magnetization direction is essentially fixed in the stacking direction, transistors are reduced from two kinds to one kind, thus achieving a simplification of the circuit, by arranging in such away that the polarity of the current is in one direction only, and owing to the circuit configuration of one transistor to one MTJ obtained thereby, a cell size equivalent to the cell size of a DRAM is realized (for example, refer to Patent Document 3).

RELATED ART DOCUMENTS

Patent Documents

Patent Document 1: JP-A-2008-28362
Patent Document 2: JP-A-2004-179483
Patent Document 3: JP-A-2006-128579

Non-Patent Documents

Non-patent Document 1: D. D. Djayaprawira et al, "230% room-temperature magnetoresistance in CoFeB/MgO/CoFeB magnetic tunnel junctions", Applied Physics Letters, Vol. 86, 092502, 2005

Non-patent Document 2: J. Hayakawa et al, "Current-induced magnetization switching in MgO barrier based magnetic tunnel junctions with CoFeB/Ru/CoFeB synthetic ferromagnetic free layer", Japanese Journal of Applied Physics, vol. 45, L1057-L1060, 2006

Non-patent Document 3: D. H. Lee et al, "Increase of temperature due to Joule heating during current-induced magnetization switching of an MgO-based magnetic tunnel junction", Applied Physics Letters, Vol. 92, 233502, 2008

SUMMARY OF THE INVENTION

Problems that the Invention is to Solve

However, as the heretofore described proposal of one diode to one MTJ means carrying out a switching with a current under a forward bias and a reverse bias via a diode, or more specifically, as it means carrying out a switching with a current under a forward bias (a forward current) and a leakage current under a reverse bias, the principle remains one wherein switching is carried out in accordance with electrode polarity. Essentially, the diode is formed in order to carry out an MTJ selection in a write, erase, and read action without disturbance. Because of this, leakage current flows not only in a reverse direction but also in a forward direction. Consequently, with the heretofore described proposal that has switching with a leakage current under a reverse bias as an operating principle, current with a value in the region of that used in the switching also flows at a time of low voltage when there is a forward bias, and the disturbance preventing effect is insufficient. That is, as the current also flows at a time of low voltage when there is a forward bias when carrying out a switching with a leakage current under a reverse bias, there occurs the same kind of disturbance problem as with a simple matrix type memory with no element selector switch, and it is impossible to realize a highly integrated element. In this way, in order to realize a cross-point type memory using one diode to one MTJ having the minimum cell area 4 $F^2$, it is not possible to employ the heretofore known STT method that has switching in accordance with current polarity as an operating principle.

Also, the proposal described in Patent Document 2 of one transistor to one MTJ circuit using an element provided with a drive layer whose magnetization direction is essentially fixed in the stacking direction is a method whereby switching is carried out by inducing a spin precession with a spin injection from the drive layer to a free layer. However, with the principle whereby a spin precession is induced with a spin injection from the drive layer, there is a problem in that the orientations (parallel or anti-parallel) of the free layer (storage layer) and pinned layer (magnetization fixed layer) are liable to be biased toward one. Furthermore, as there is also concern about the magnetization orientation of the pinned layer (magnetization fixed layer) changing, a problem occurs in that, even when realizing a rewrite quantity equivalent to that of a DRAM, reliability decreases. Because of this, it is difficult to realize a one transistor to one MTJ circuit wherein switching is carried out under a condition that the current has only one polarity.

The invention, having been contrived bearing in mind the heretofore described problems, has an object of providing a magnetoresistance element with a configuration such that a stable switching action is possible with a current flowing in response to the application of a unipolar electrical pulse, and a non-volatile semiconductor storage device using the magnetoresistance element.

Means for Solving the Problems

The inventors of the present application, as a result of examining the heretofore described problems by returning to the operating principle of a spin torque transfer (STT) method in a magnetoresistance element, have arrived at the invention of a magnetoresistance element, and a non-volatile semiconductor storage device using the magnetoresistance element, shown hereafter.

That is, a first magnetoresistance element according to the invention includes a magnetic tunnel junction portion configured by sequentially stacking a perpendicularly magnetized first magnetic body, an insulation layer, and a perpendicularly magnetized second magnetic body, and is characterized in that the second magnetic body has a configuration wherein a ferromagnetic layer and a rare earth-transition metal alloy layer are stacked sequentially from the insulation layer side interface, a heat assist layer that heats the second magnetic body with a heat generated based on a current flowing through the magnetic tunnel junction portion is further provided, and the magnetization direction of the second magnetic body is reversed by the heating of the second magnetic body.

In the heretofore described configuration, the second magnetic body that records data as a magnetization direction is heated by the heat assist layer when writing, changing the magnetization direction thereof. By controlling the magnetization direction of the second magnetic body via the temperature of the second magnetic body heated by the heat assist layer, a switching action with a unipolar electrical pulse is possible.

A second magnetoresistance element according to the invention includes a magnetic tunnel junction portion configured by sequentially stacking a perpendicularly magnetized first magnetic body, an insulation layer, and a perpendicularly magnetized second magnetic body, and is characterized in that the first magnetic body has a configuration wherein a ferromagnetic layer and a rare earth-transition metal alloy layer are stacked sequentially from the insulation layer side interface, a heat assist layer that heats the first magnetic body with a heat generated based on a current flowing through the magnetic tunnel junction portion is further provided, and the magnetization direction of the first magnetic body is reversed by the heating of the first magnetic body.

In the heretofore described configuration, the first magnetic body is heated by the heat assist layer when writing, changing the magnetization direction thereof around a compensated temperature. By controlling the magnetization direction of the first magnetic body via the temperature of the first magnetic body heated by the heat assist layer, a switching action with a unipolar electrical pulse is possible.

A non-volatile semiconductor storage device according to the invention is characterized by including the heretofore described magnetoresistance element, a switching element connected in series to the magnetoresistance element, information rewriting means that carries out a write and erase by causing a write current to flow through the magnetoresistance element, and reading means that reads information stored from the amount of current flowing through the magnetoresistance element.

According to the heretofore described non-volatile semiconductor storage device, as it is possible to carry out a switching with a unipolar electrical pulse, it is possible to configure a 4 $F^2$ sized memory cell formed from one diode and one MTJ. Because of this, it is possible to provide a highly integrated, high performance non-volatile semiconductor storage device at a low cost.

Advantage of the Invention

According to the invention, it is possible to provide a magnetoresistance element with which it is possible to carry out a stable switching action with a write current based on a unipolar electrical pulse. Also, according to the invention, it is possible to provide a small, highly reliable non-volatile semiconductor storage device using the heretofore described magnetoresistance element.

BRIEF DESCRIPTION OF THE DRAWINGS

FIG. 12 is a schematic diagram showing an operating principle of the magnetoresistance element according to the heretofore known technology.

MODE FOR CARRYING OUT THE INVENTION

Hereafter, a description will be given, based on the drawings, of embodiments of a magnetoresistance element according to the invention, and a storage device using the magnetoresistance element.

First Embodiment

Figure 1:
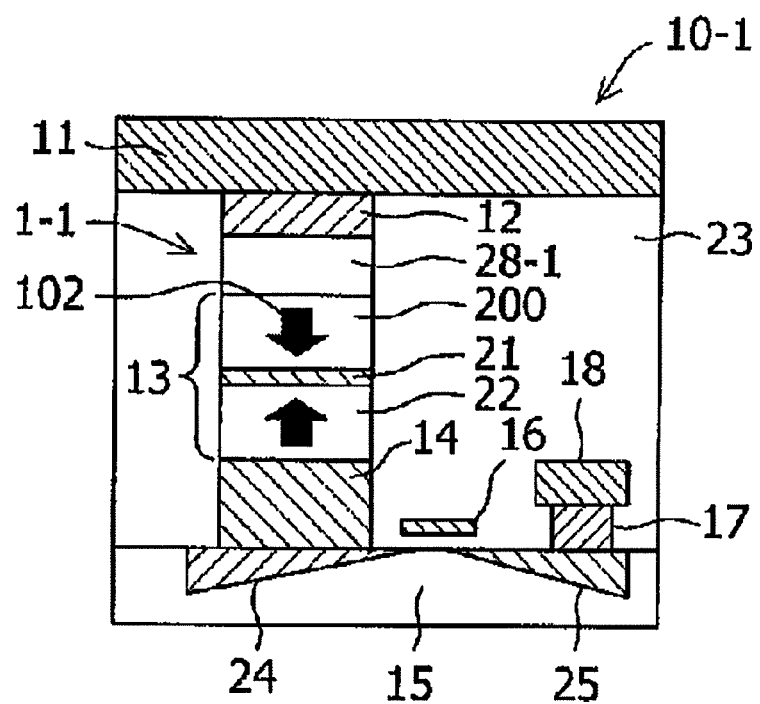
FIG. 1 is a sectional view showing a configuration of a magnetoresistance element according to a first embodiment of the invention.
Figure 11:
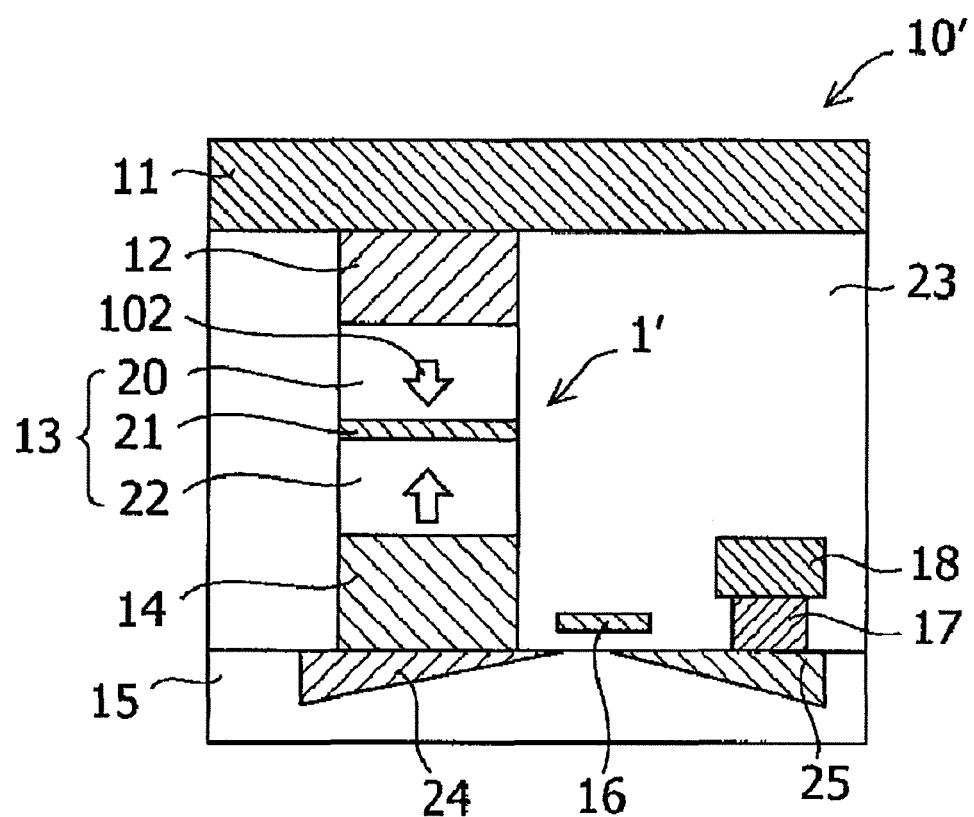
FIG. 11 is a sectional view showing an example of a configuration of a magnetoresistance element according to a heretofore known technology.

FIG. 1 is a partial enlarged sectional view of a storage device 10-1 showing a portion in which is disposed a magnetoresistance element 1-1 according to the invention. In FIG. 1, components the same as components shown in FIG. 11 are given the same reference numerals, and a description thereof is omitted. The configuration of the magnetoresistance element 1-1 in the first embodiment differs from that of a heretofore known magnetoresistance element 1 in that a storage layer 200 (a second magnetic body) is used instead of a storage layer 20 of the magnetoresistance element 1 shown in FIG. 11, and that a heat assist layer 28-1 is deposited on the storage layer 200. In the embodiment, the storage layer 200 and a pinned layer 22 are each formed of a perpendicularly magnetized film.

The storage layer 200 is configured of a ferromagnetic layer (not shown) and a rare earth-transition metal alloy layer (not shown) stacked sequentially from an insulation layer 21 side interface. The ferromagnetic layer is formed of an N-type ferrimagnetic body.

Meanwhile, the heat assist layer 28-1 is formed of a normal resistive material, as will be described hereafter. The heat assist layer 28-1 is disposed in a way such as to make contact with an interface on the side of the storage layer 200 opposite to the insulation layer 21 side interface.

As an operating principle of a read of the magnetoresistance element 1-1 is the same as that of the heretofore known magnetoresistance element, a description thereof will be omitted.

Figure 2:
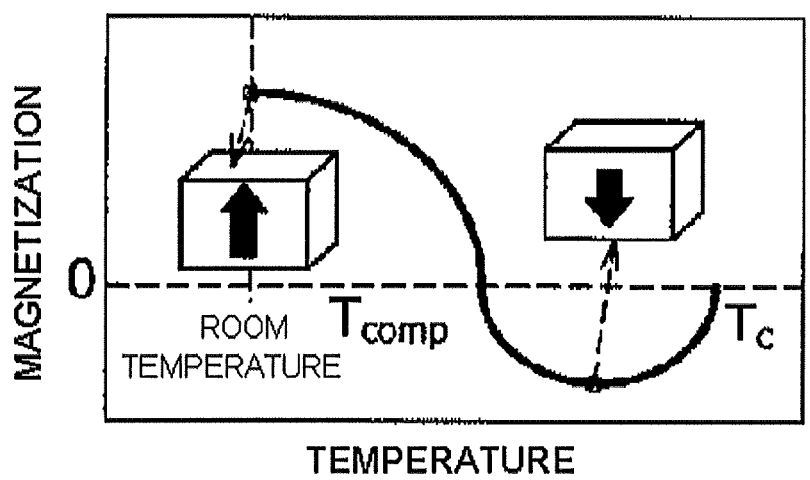
FIG. 2 is a graph showing magnetization-temperature characteristics of the magnetoresistance element according to the first embodiment.

Next, a description will be given of a principle whereby a write action using a unipolar electrical pulse is possible with the magnetoresistance element 1-1 configured in such a way. In the embodiment, as has already been described, an N-type ferrimagnetic body is used as the ferromagnetic layer in the storage layer 200. The N-type ferrimagnetic body has the kind of magnetization-temperature characteristics shown in FIG. 2. An important point is that when a certain temperature (a compensated temperature $T_{comp}$) is exceeded, the magnetization direction of the storage layer 200 is reversed. Herein, it is taken that the compensated temperature of the storage layer 200 is approximately 110° C. The compensated temperature can easily be set by adjusting the composition ratios of the rare earth element and transition metal element in the rare earth-transition metal alloy layer in the storage layer 200. This is also one reason for using a rare earth-transition metal alloy in the storage layer 200.

For a write action from a high resistance condition to a low resistance condition, a spin torque transfer (STT) action the same as in the heretofore known magnetoresistance element is carried out. That is, as shown in FIG. 11, in the heretofore known magnetoresistance element, the storage layer 20 changes from a high resistance condition (FIG. 12(a)) to a low resistance condition (FIG. 12(b)) by a current 103 being caused to flow from the storage layer 20 (a second magnetic body) toward a pinned layer 22 (a first magnetic body). In the storage layer 200 in the embodiment too, it is possible to cause a change from a high resistance condition to a low resistance condition by causing the same kind of current to flow.

Hereafter, a description will be given, using FIG. 3, of a write action from a low resistance condition to a high resistance condition. In FIG. 3, arrows 102 and 102A indicate magnetization directions. The heat assist layer 28-1 shown in FIG. 1 is omitted from FIG. 3.

Figure 3A:
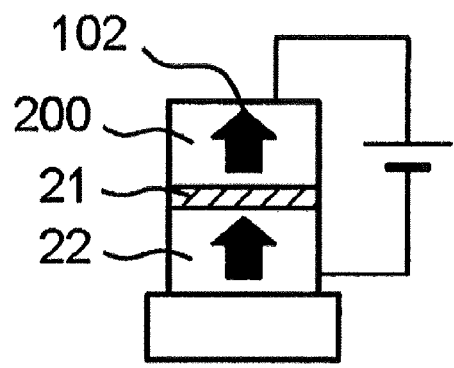
FIG. 3 is a schematic diagram showing an operating principle of the magnetoresistance element according to the first embodiment.
Figure 3B:
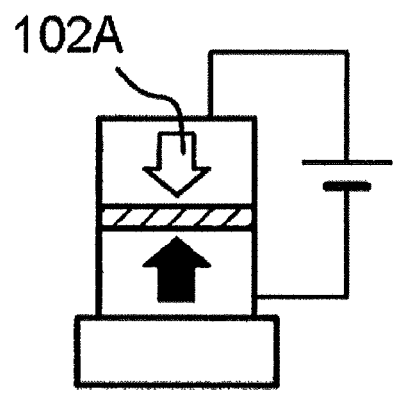
Figure 3C:
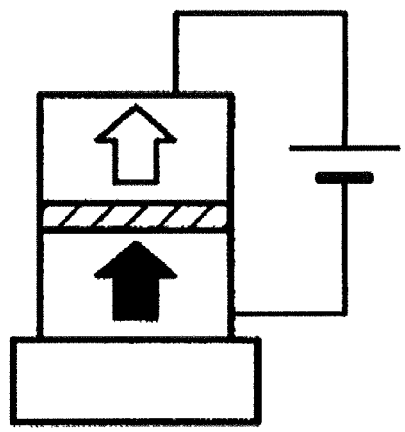
Figure 3D:
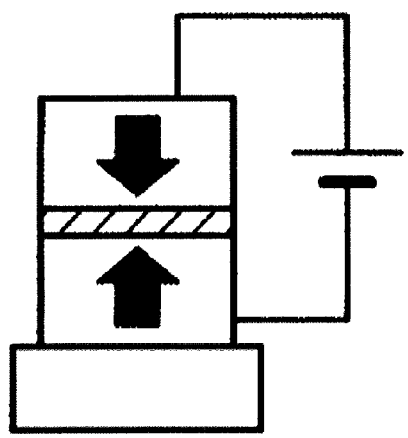

Firstly, when a write current flows, Joule heat is generated owing to the resistance (up to 4 kΩ) of the heat assist layer 28-1, the heat is transmitted from the heat assist layer 28-1 to the storage layer 200, and the storage layer 200 is heated (FIG. 3(a)). When the temperature of the storage layer 200 exceeds the compensated temperature $T_{comp}$ owing to the heating, the net magnetization of the storage layer 200 is reversed (FIG. 3(b)). By an STT action being carried out in this condition, the storage layer 200 receives a torque directed in the same direction as the pinned layer, and reverses the magnetization direction at this point (FIG. 3(c)). When the supply of the write current stops, the temperature of the storage layer 200 decreases, and the reversed magnetization returns to the original condition when the temperature becomes lower than the compensated temperature $T_{comp}$. Because of this, the magnetization directions of the storage layer 200 and pinned layer 22 are opposed directions, and the write action from the low resistance condition to the high resistance condition is completed (FIG. 3(d)).

Herein, for example, TbCo, GdCo, GdFeCo, TbFeCo, or the like, is preferably used as the material of the rare earth-transition metal alloy layer in the storage layer 200 (the second magnetic body) and, for example, a spin-polarized material such as Fe, FeCo, FeCoB, or the like, is preferably used as the material of the ferromagnetic layer in the storage layer 200. As the rare earth-transition metal alloy layer is such that, as previously described, the compensated temperature can easily be adjusted using the composition thereof, the heretofore described action is easily realized, and also, as the rare earth-transition metal alloy layer has a large amount of perpendicular magnetic anisotropic energy ($10^5$ to $10^6$ erg/cc), it can store data for a long period.

It is assumed that the spin-polarized material used as the material of the ferromagnetic layer indicates one of the following two kinds of alloy.

(1) A material with a high spin-polarization rate (for example, a half metal such as a Heusler alloy)

(2) A magnetic body wherein the spin is completely polarized with respect to a Δ1 band, as with, for example, Fe, FeCo, FeCoB, or the like.

The reason for including the magnetic body of (2), whose spin-polarization rate is not so high, in the spin-polarized materials is as follows. That is, it is because, when a spin tunnel junction is configured by combining the magnetic body (Fe, FeCo, FeCoB, or the like) of (2) with an insulation layer (for example, an insulation layer formed from Mg) having four-fold symmetry with respect to the stacking direction, the insulation layer acts in such a way as to selectively allow the Δ1 band conduction electrons to pass through, and it is possible to increase the effective spin-polarization rate. With this kind of configuration using FeCo, or the like, it is both theoretically and experimentally demonstrated that, by optimizing the conditions, a magnetoresistance ratio in the region of 1000% is obtained.

Meanwhile, it is desirable that the heat assist layer 28-1 is given a resistance value in the region of 1 kΩ to 50 kΩ. As an STT type write current in an MRAM is in the region of 0.5 to $1 \times 10^6$ A/cm$^2$, the element temperature exceeds 500° C. when the resistance value of the heat assist layer 28-1 exceeds 50 kΩ, and there is a danger of element breakup. Also, when the resistance value of the heat assist layer 28-1 is in the region of a few hundred Ohms, the temperature rise decreases (a few degrees Celsius), and the heretofore described action becomes difficult. Therefore, a range of 1 kΩ to 50 kΩ is good for the resistance value of the heat assist layer 28-1. Then, when considering the fabrication process, it is desirable that the heat assist layer 28-1 is rather thin (10 to 20 nm). Based on the above, a material having a resistivity of 0.01 Ωcm to 10 Ωcm is appropriate as the heat assist layer 28-1. For example, $TaN_x$, $TaO_x$, $TiO_x$, or the like, are included as this kind of material.

Next, a description will be given, referring to FIG. 5a to FIG. 5g, of a fabrication method of the magnetoresistance element according to the first embodiment.

Figure 5A:
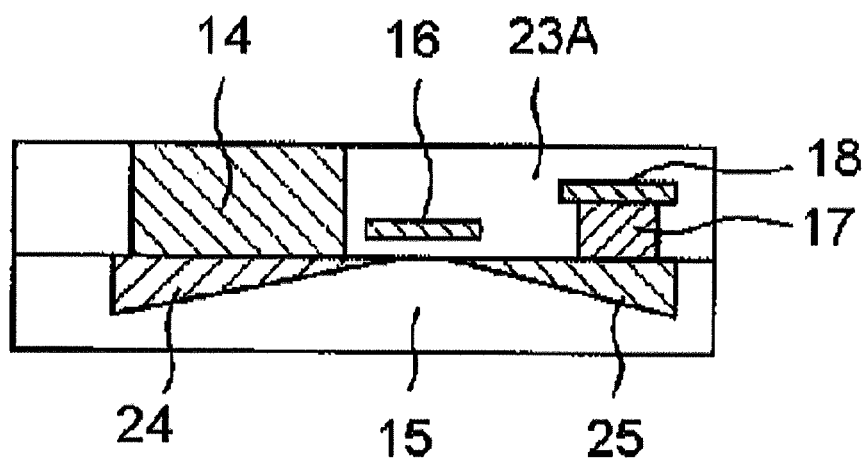
FIG. 5a is a sectional view showing a first fabrication step of the magnetoresistance element according to the first embodiment.

Firstly, a drain region 24, a source region 25, a gate line 16, a contact portion 17, a word line 18, a lower electrode 14, and an insulation body 23A are formed on a silicon substrate 15 using a normal CMOS process (FIG. 5a).

Figure 5B:
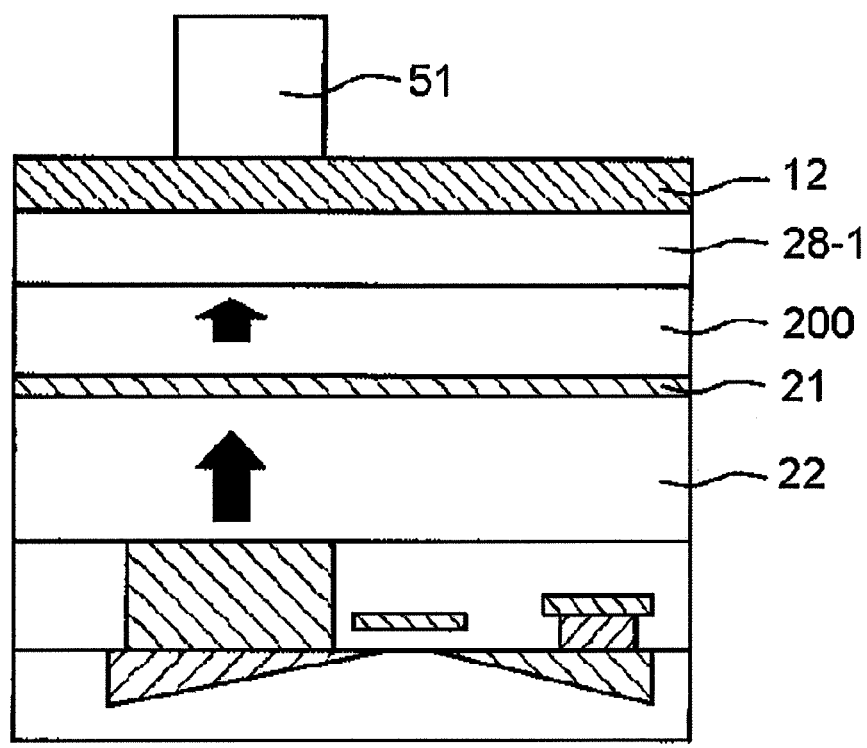
FIG. 5b is a sectional view showing a second fabrication step of the magnetoresistance element according to the first embodiment.

Next, as shown in FIG. 5b, after stacking the pinned layer 22 ($Tb_{16}Fe_{59}Co_{25}$ of 5 nm thickness, $Fe_{10}Co_{90}$ of 1 nm thickness), the insulation layer 21 (MgO of 0.7 nm thickness), and the storage layer 200 ($Fe_{10}Co_{90}$ of 1 nm thickness, $Gd_{22}Co_{78}$ of 2 nm thickness) using a magnetron sputtering method, the heat assist layer 28-1 (TaN of 20 nm thickness) is deposited using a reactive sputtering method, and finally, an upper electrode 12 (Ta of 2 nm thickness/Ru of 5 nm thickness) is deposited using a magnetron sputtering method.

Figure 5C:
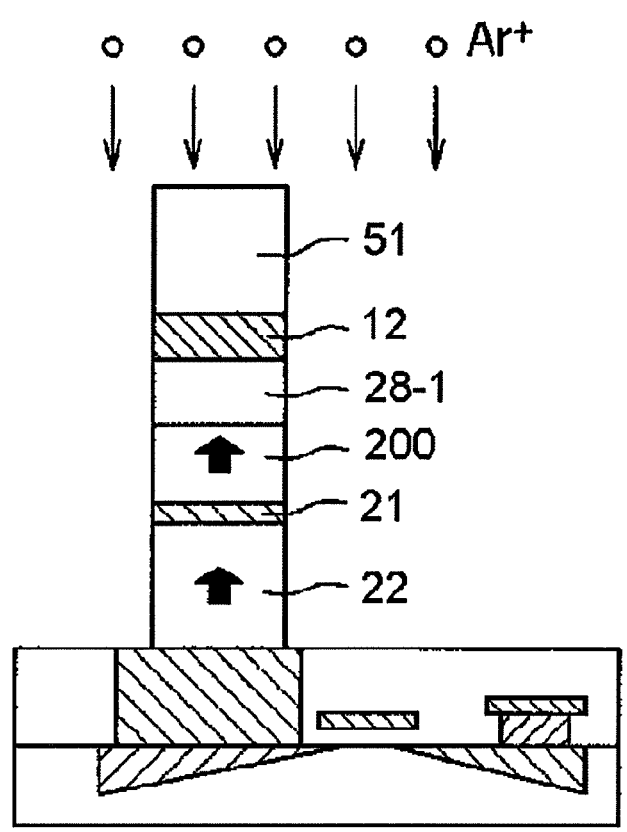
FIG. 5c is a sectional view showing a third fabrication step of the magnetoresistance element according to the first embodiment.
Figure 5D:
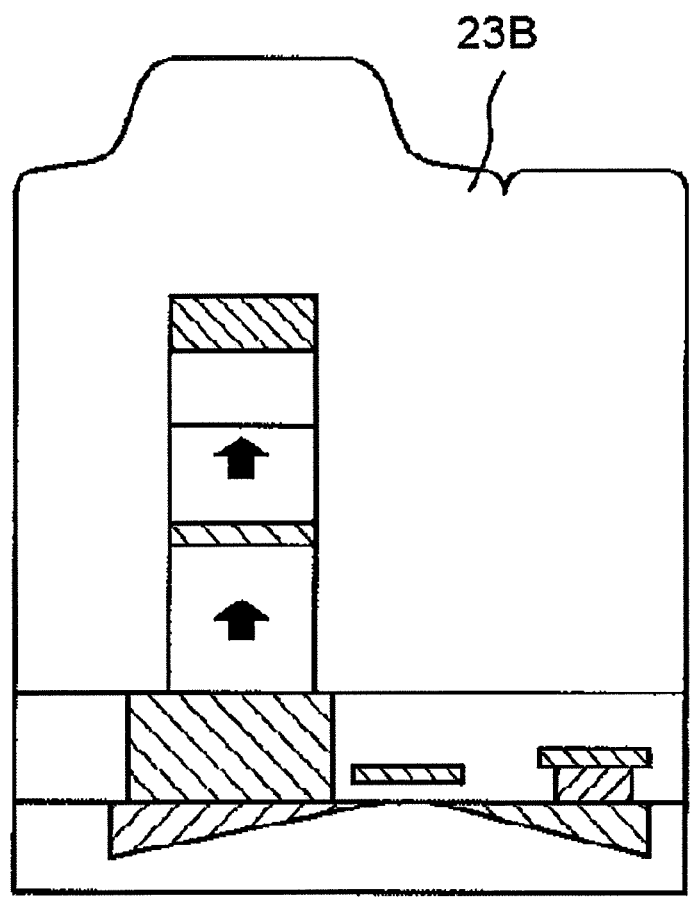
FIG. 5d is a sectional view showing a fourth fabrication step of the magnetoresistance element according to the first embodiment.
Figure 5E:
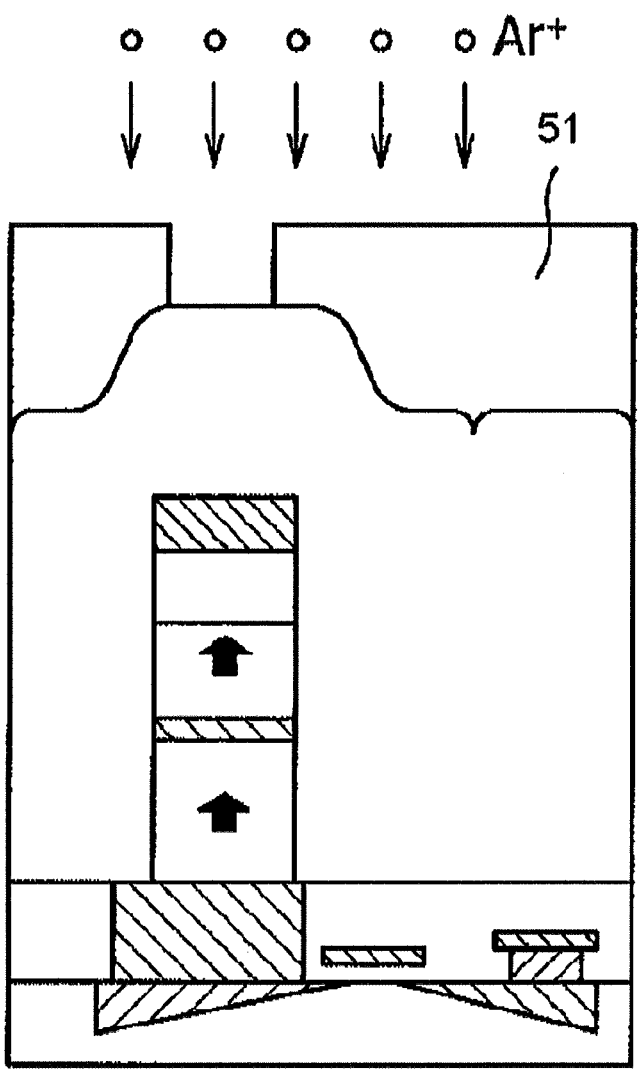
FIG. 5e is a sectional view showing a fifth fabrication step of the magnetoresistance element according to the first embodiment.
Figure 5F:
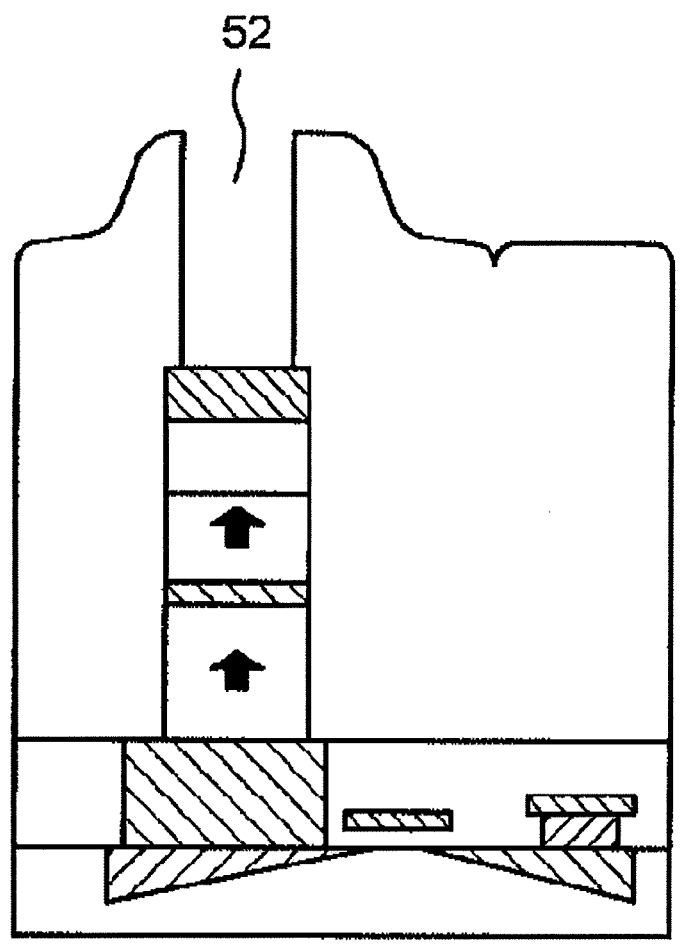
FIG. 5f is a sectional view showing a sixth fabrication step of the magnetoresistance element according to the first embodiment.
Figure 5G:
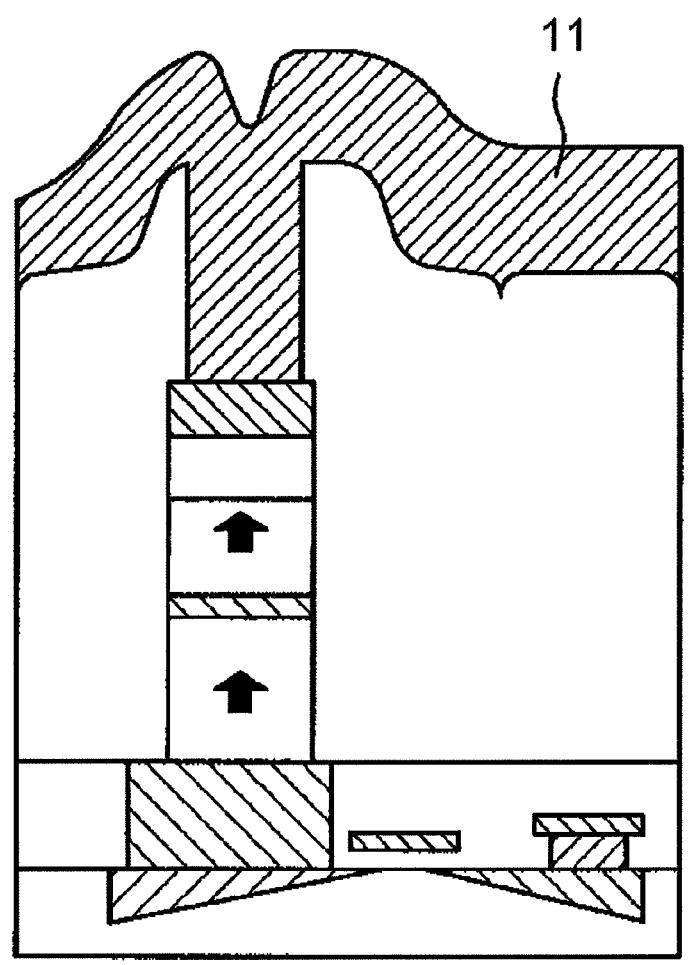
FIG. 5g is a sectional view showing a seventh fabrication step of the magnetoresistance element according to the first embodiment.

Next, a resist 51 is exposed and developed in a circular form with a diameter in the region of 100 nm using photolithography. Next, as shown in FIG. 5c, the sputtered film other than in the resist portion is scraped off using an ion etching. After the resist is removed using a solvent, ashing, or the like, an interlayer insulation film 23B ($SiO_2$ of 60 nm thickness) is deposited (FIG. 5d). Subsequently, a contact hole 52 is formed using photolithography in a portion above the upper electrode 12 (FIG. 5e, FIG. 5f). Subsequently, a bit line 11 is formed (FIG. 5g). In the way heretofore described, it is possible to fabricate a magnetic memory in the first embodiment of the invention. An oxide protective layer (for example, a Ta layer, a Ru layer, or the like) of a few nanometers may be deposited between the storage layer 200 and heat assist layer 28-1 with an object of suppressing oxygen diffusion from the heat assist layer 28-1, allowing a stable action for a longer time.

Next, a description will be given of a specific action of the magnetoresistance element 1-1 according to the embodiment.

The compensated temperature $T_{comp}$ of the $Gd_{22}Co_{78}$ used in the storage layer 200 is around 110° C. Therefore, when taking the element size (diameter) to be 100 nm, the heat assist layer 28-1 resistance value to be 4 kΩ, the current density to be $8 \times 10^5$ A/cm$^2$, and the write current pulse width to be 10 ns, and furthermore, approximating that approximately one half of the Joule heat generated in the heat assist layer 28-1 contributes to the temperature rise of the element, the temperature of the element 1-1 rises approximately 110° C., and consequently, when taking room temperature to be 20° C., the actual element temperature is 130° C. As this is equal to or higher than the compensated temperature $T_{comp}$, the heretofore described write action from a low resistance condition to a high resistance condition is realized. Also, when the current density is $6.6 \times 10^5$ A/cm$^2$, the temperature rise is in the region of 75° C., and as the element temperature is 95° C., which is lower than the compensated temperature $T_{comp}$, the write action from a high resistance condition to a low resistance condition is realized. In this way, depending on the size of the write current pulse, it is possible to write both a low resistance condition and a high resistance condition with a current of the same polarity.

Second Embodiment

A description will be given, referring to FIG. 6, of a second embodiment of the invention. A magnetoresistance element 1-2 according to the second embodiment differs from the first embodiment in that the pinned layer 22 (the first magnetic body) in the first embodiment shown in FIG. 1 is replaced with a pinned layer 220, a heat assist layer 28-2 is provided instead of the heat assist layer 28-1 in the first embodiment, and the storage layer 200 (the second magnetic body) in the first embodiment is replaced with the storage layer 20 shown in FIG. 11.

The pinned layer 220 (a first magnetic body) has the configuration of the storage layer 200 of FIG. 1. That is, the pinned layer 220 is configured of a ferromagnetic layer and a rare earth-transition metal alloy layer stacked sequentially from the insulation layer 21 side interface.

Meanwhile, the heat assist layer 28-2 is formed of the same material as the heat assist layer 28-1 of FIG. 1, and is disposed in a way such as to make contact with an interface on the side of the pinned layer 220 opposite to the insulation layer 21 side interface.

Next, a description will be given of an operating principle of the magnetoresistance element 1-2 according to the second embodiment.

As a write action from a high resistance condition to a low resistance condition is exactly the same as with heretofore known technology, in the same way as in the first embodiment, a description thereof will be omitted. Hereafter, a description will be given, referring to FIG. 4, of a write action from a low resistance condition to a high resistance condition. In FIG. 4, arrows 102 and 102A indicate magnetization directions. In the second embodiment, it is taken that the compensated temperature $T_{comp}$ of the storage layer 20 is 200° C. or more, and the compensated temperature $T_{comp}$ of the pinned layer 220 is around 110° C.

Figure 4A:
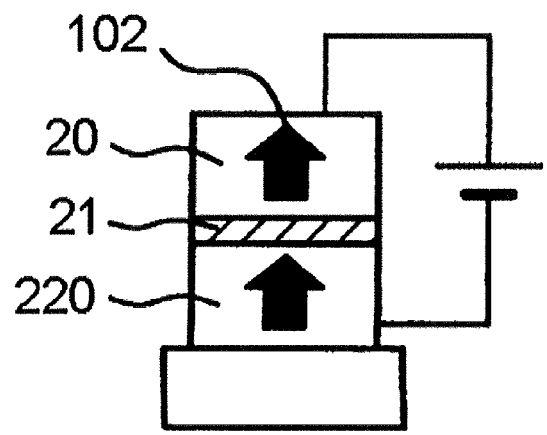
FIG. 4 is a schematic diagram showing an operating principle of a magnetoresistance element according to a second embodiment.
Figure 4B:
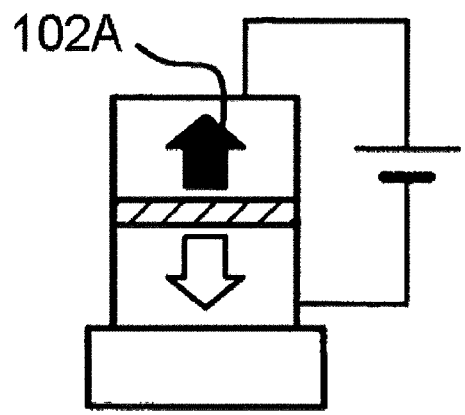
Figure 4C:
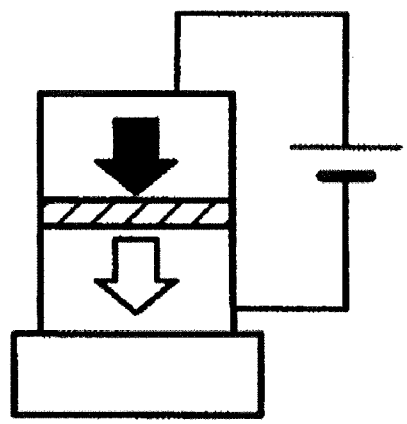
Figure 4D:
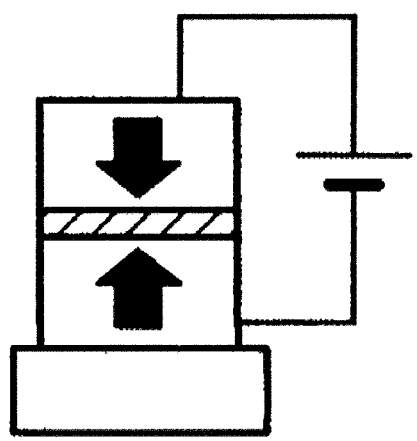

Firstly, when a write current flows, Joule heat is generated owing to the resistance (up to 4 kΩ) of the heat assist layer 28-2, the heat is transmitted from the heat assist layer 28-2 to the pinned layer 220, and the pinned layer 220 is heated (FIG. 4(a)). When the temperature of the pinned layer 220 exceeds the compensated temperature $T_{comp}$ owing to the heating, the net magnetization of the pinned layer 220 is reversed (FIG. 4(b)). By an STT action being carried out in this condition, the storage layer 20 receives a torque directed in the same direction as the pinned layer 220, and reverses the magnetization direction at this point (FIG. 4(c)). When the supply of the write current stops, the temperature of the pinned layer 220 decreases, and the reversed magnetization returns to the original condition when the temperature becomes lower than the compensated temperature $T_{comp}$. Because of this, the magnetization directions of the storage layer 20 and pinned layer 220 are opposed directions, and the write action from the low resistance condition to the high resistance condition is completed (FIG. 4(d)).

Next, a description will be given of a fabrication method of the magnetoresistance element according to the second embodiment.

Firstly, as shown in FIG. 5a, the drain region 24, the source region 25, the gate line 16, the contact portion 17, the word line 18, the lower electrode 14, and the insulation body 23A are formed on the silicon substrate 15 using a normal CMOS process. Next, as shown in FIG. 5b, the heat assist layer 28-2 (Ta of 20nm thickness), the pinned layer 220 ($Tb_{24}Fe_{53}Co_{23}$ of 5 nm thickness, $Fe_{10}Co_{90}$ of 1 nm thickness), the insulation layer 21 (MgO of 0.7 nm thickness), the storage layer 20 ($Fe_{10}Co_{90}$ of 1 nm thickness, $Gd_{22}Co_{78}$ of 2 nm thickness), and the upper electrode 12 (Ta of 2 nm thickness/Ru of 5 nm thickness) are deposited sequentially using a magnetron sputtering method. As a subsequent process is the same as in the first embodiment, a description will be omitted.

In the magnetoresistance element 1-2 according to the second embodiment, the compensated temperature $T_{comp}$ of the $Tb_{24}Fe_{53}Co_{23}$ used in the pinned layer 220 is around 110° C. Consequently, in the same way as in the first embodiment, owing to the temperature change of the heat assist layer 28-2 depending on the size of the write current pulse, it is possible to write both a low resistance condition and a high resistance condition with a current of the same polarity.

Third Embodiment

A description will be given of a third embodiment of the invention. The third embodiment uses a metal-insulator transition material in the heat assist layer 28-2 in a configuration of the magnetoresistance element 1-2 based on the second embodiment. The transition temperature of the heat assist layer 28-2 exists in a range of temperatures from room temperature to the compensated temperature of the storage layer 20.

Figure 7:
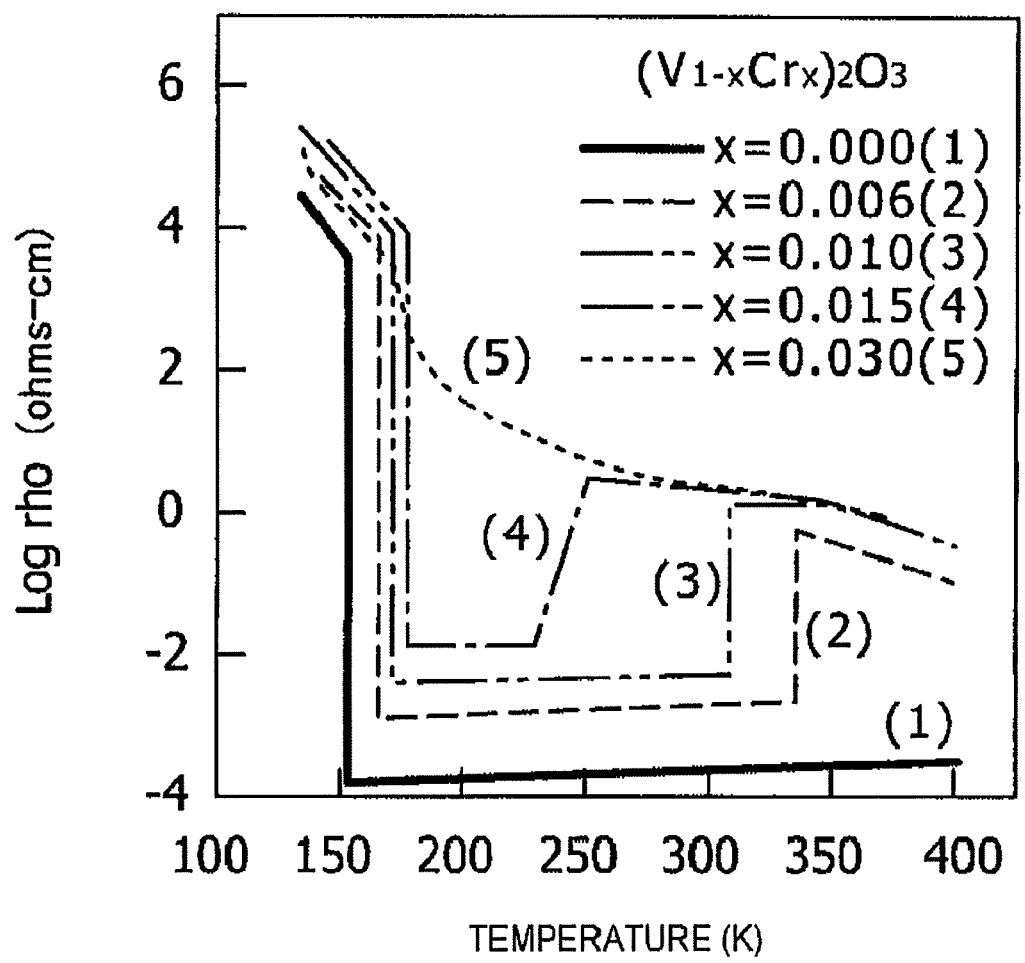
FIG. 7 is a graph showing change in resistivity of a metal-insulator transition material.

A description will be given of a principle whereby a write action using a unipolar current is stabilized in the magnetoresistance element 1-2 configured in such a way. FIG. 7 is a graph showing a change in the resistivity of the metal-insulator transition material used in the heat assist layer 28-2. The heretofore mentioned metal-insulator transition material indicates a kind of material whose resistivity increases sharply at a temperature equal to or higher than room temperature, as shown in FIG. 7. For example, $(CrV)_2O_3$ is applied as this material. In the embodiment, a material used is such that a Cr substitution content x of the material $(CrV)_2O_3$ given above as an example is taken to be in the region of x=0.06, and a transition temperature $T_T$ thereof is taken to be in the region of 90° C. Also, the compensated temperature $T_{comp}$ of the pinned layer 220 is taken to be approximately 110° C., and a relationship is such that $T_T < T_{comp}$.

Firstly, when a write current is caused to flow, Joule heat is generated in the insulation layer 21. When the thickness of the insulation layer 21 is 1.0 nm, resistivity (RA) is up to 10 Ωcm, and a resistance value (R) is 1.3 kΩ. Consequently, when taking the write current to be 70 μA, and the write current pulse width to be 10 ns, the element temperature rises 60° C. owing to the Joule heat, reaching 80° C. In this condition, the temperature of the pinned layer 220 is lower than the compensated temperature $T_{comp}$, and a write action from a high resistance condition to a low resistance condition is realized.

Also, as the element temperature exceeds the transition temperature (90° C.) of the heat assist layer 28-2 when taking the write current to be 75 μA and the write current pulse width to be 10 ns, the resistivity of the heat assist layer 28-2 leaps by two digits. As a result of this, the amount of heat generated in the heat assist layer 28-2 increases sharply, and the element temperature rises suddenly to in the region of 130° C. Because of this, the element temperature is equal to or higher than the compensated temperature $T_{comp}$ of the pinned layer 220, and a write action from a low resistance condition to a high resistance condition is realized. As a large temperature change is induced with only a small increase in the current in this way, even when there is variation in the compensated temperatures of individual elements 1-2 manufactured, a stable write action is realized without taking too much of a current margin.

Next, a description will be given of a fabrication method of the magnetoresistance element according to the third embodiment.

Firstly, as shown in FIG. 5*a*, the drain region 24, the source region 25, the gate line 16, the contact portion 17, the word line 18, the lower electrode 14, and the insulation body 23A are formed on the silicon substrate 15 using a normal CMOS process. Next, as shown in FIG. 5*b*, the substrate is heated to 350° C., and the heat assist layer 28-2 ($Cr_{0.012}V_{1.988}O_3$ of 2 nm thickness) is deposited using a magnetron sputtering method. Subsequently, the pinned layer 220 ($Tb_{24}Fe_{53}Co_{23}$ of 5 nm thickness, $Fe_{10}Co_{90}$ of 1 nm thickness), the insulation layer 21 (MgO of 0.7 nm thickness), the storage layer 20 ($Fe_{10}Co_{90}$ of 1 nm thickness, $Gd_{22}Co_{78}$ of 2 nm thickness), and the upper electrode 12 (Ta of 2 nm thickness/Ru of 5 nm thickness) are deposited sequentially. As a subsequent process is the same as in the first embodiment, a description will be omitted.

Herein, a metal-insulator transition material having a transition temperature in a temperature range of room temperature to in the region of 350° C., as does, for example, $(CrV)_2O_3$, LaSrMnO, or the like, is appropriate as a material of the heat assist layer 28-2. This is because when the pinned layer 220 is heated to a temperature higher than 350° C., there is a danger of the rare earth-transition metal alloy included in the pinned layer 220 crystallizing.

Also, even though no extremely sharp change in resistivity is exhibited at the transition temperature $T_T$, as with these alloys, it is possible, even when using a PTC (positive temperature coefficient) material (having a positive temperature coefficient of resistance) whose resistivity increases owing to a temperature rise in a temperature range of room temperature to the compensated temperature, to stabilize a write action using a unipolar current according to the same principle. For example, $LaSrCuO_4$, $BaTiO_3$ doped with a third period element (for example, $BaNaTiO_3$, or the like), $YBa_2Cu_3O_7$, $Sr_2Cu_3O_5$, $LaSrCoO_3$, $NaNbO_3$, $BiFeO_3$, and the like, are known as this kind of material.

When using the heretofore described PTC material, a kind of material whose resistivity always increases in the temperature range of room temperature to the compensated temperature may be used but, this not being indispensable, provided that the resistivity increases in a temperature range of in the region of ±5° C. of the compensated temperature, it is sufficient for the heretofore described action. However, it is desirable that the change of resistance value in the range of ±5° C. is 500Ω or more. For example, when the write current is reduced to around $5 \times 10^5$ A/cm², it can be calculated that at a resistance of 500Ω there is a contribution to temperature rise of approximately a little under 10° C. This is because, even when the variation of the composition of the rare earth-transition metal alloy in the pinned layer 220 in individual magnetoresistance elements 1-2 manufactured is kept to within ±0.2%, the variation of the compensated temperature is estimated to be in the region of 7 to 8%, and it is considered that in the region of 10° C. is suitable as a margin.

Figure 8:
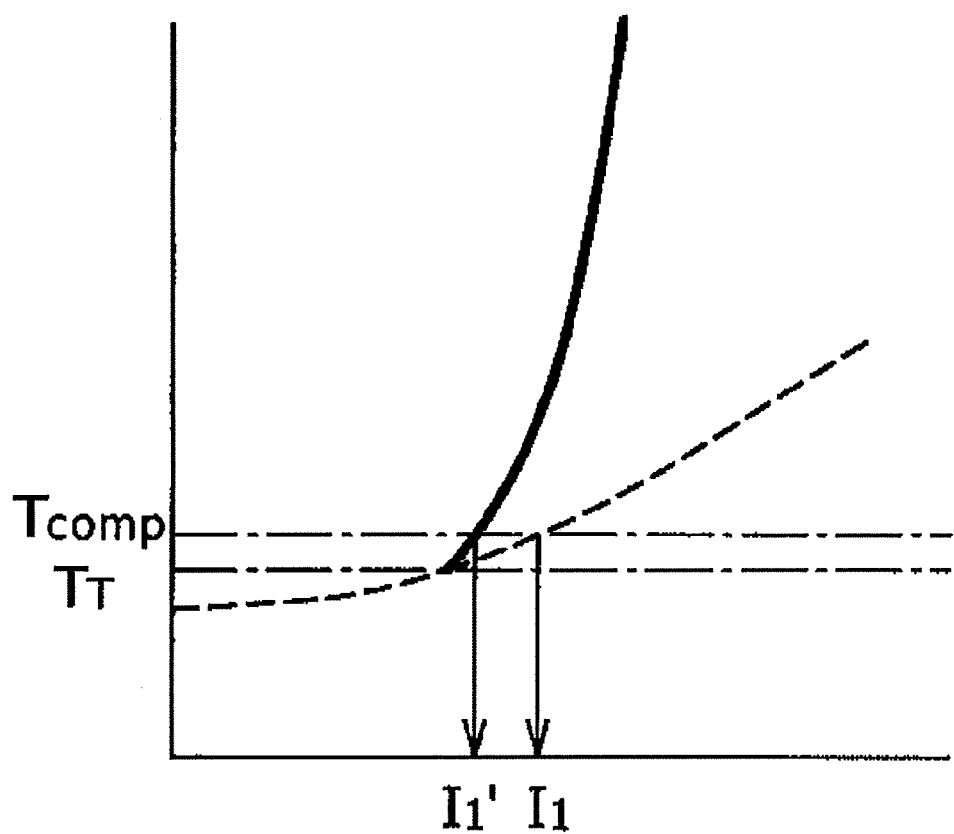
FIG. 8 is a graph illustrating an action of a magnetoresistance element according to a third embodiment.

Of materials $(V_{1-x}Cr_x)_2O_3$ used as the heat assist layer 28-2, a material $(Cr_{0.006}V_{0.994})_2O_3$, wherein x=0.006, has a metal-insulator transition temperature of around 90° C., and the resistivity increases by two digits with this temperature as a borderline. When taking the current value of a write action from a high resistance condition to a low resistance condition to be 70 μA, the element temperature is 80° C., as heretofore described. Also, when taking the current value of a write action from a low resistance condition to a high resistance condition to be 75 μA, the element temperature is 130° C., and it is possible to secure a margin of 20° C. with respect to the compensated temperature. Imagining that there are no heat assist layer 28-2, a current of 95 μA would be appropriate in order for the element temperature to become 130° C. FIG. 8 shows an example of a relationship between the current caused to flow through the heat assist layer 28-2 and the temperature of the magnetoresistance element 1-2. In FIG. 8, the dotted line shows current-temperature characteristics when the heat assist layer 28-2 is formed of the normal resistive material used in the first and second embodiments, and the solid line shows current-temperature characteristics when the heat assist layer 28-2 is formed of the metal-insulator transition material. As shown in FIG. 8, when the metal-insulator transition material is used in the heat assist layer 28-2, the current value appropriate in order to secure the same temperature margin drops from $I_1$ to $I_1'$. In this way, according to the memory in the embodiment, it is possible to realize a stable write action, even when the current is low.

Even when applying the material of the heat assist layer in the embodiment to the heat assist layer 28-1 of the first embodiment, it is possible to achieve the same benefit as in the embodiment.

Fourth Embodiment

Figure 6:
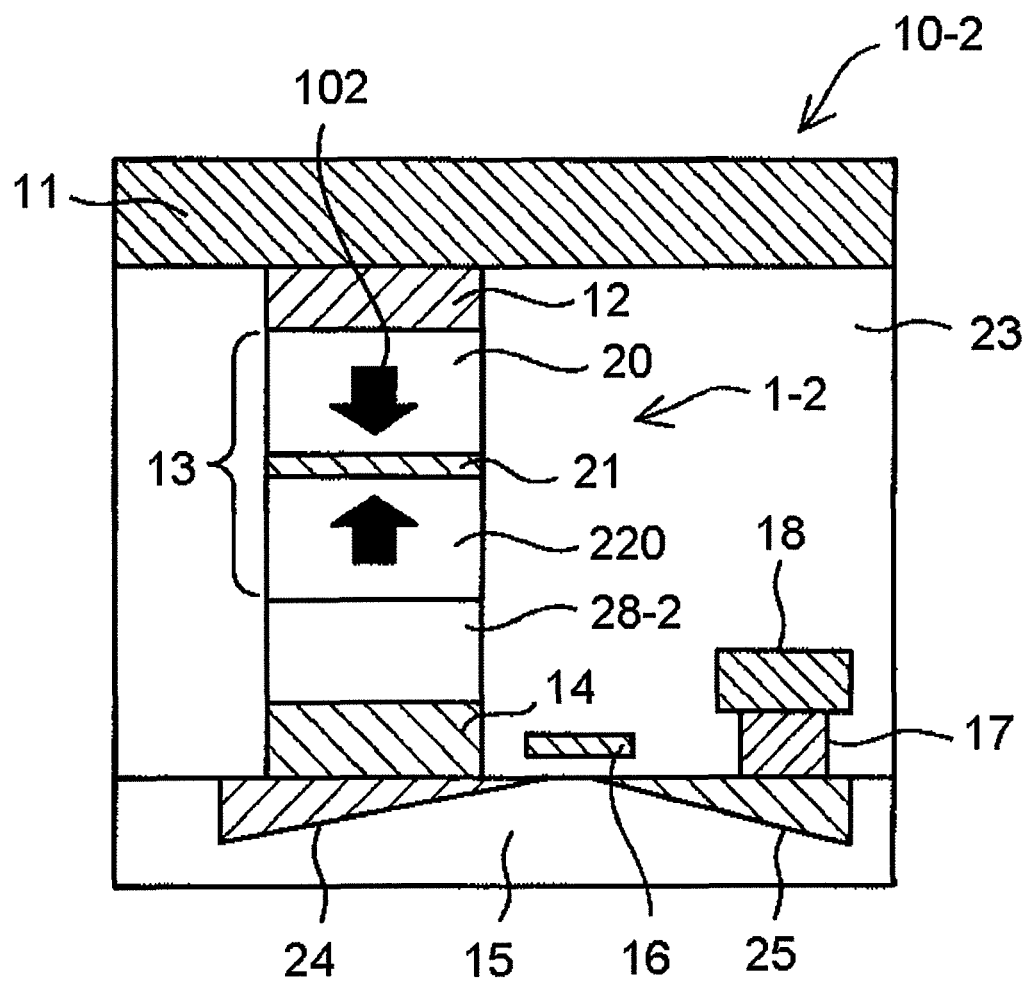
FIG. 6 is a sectional view showing a configuration of the magnetoresistance element according to the second embodiment of the invention.
Figure 9:
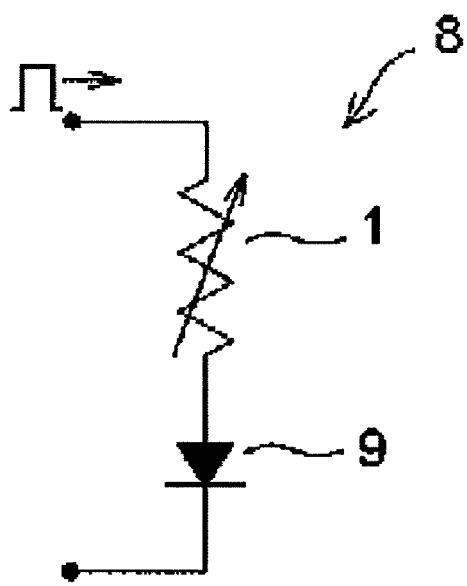
FIG. 9 is a schematic diagram showing a memory cell using the magnetoresistance elements shown in FIG. 1 and FIG. 6.
Figure 10:
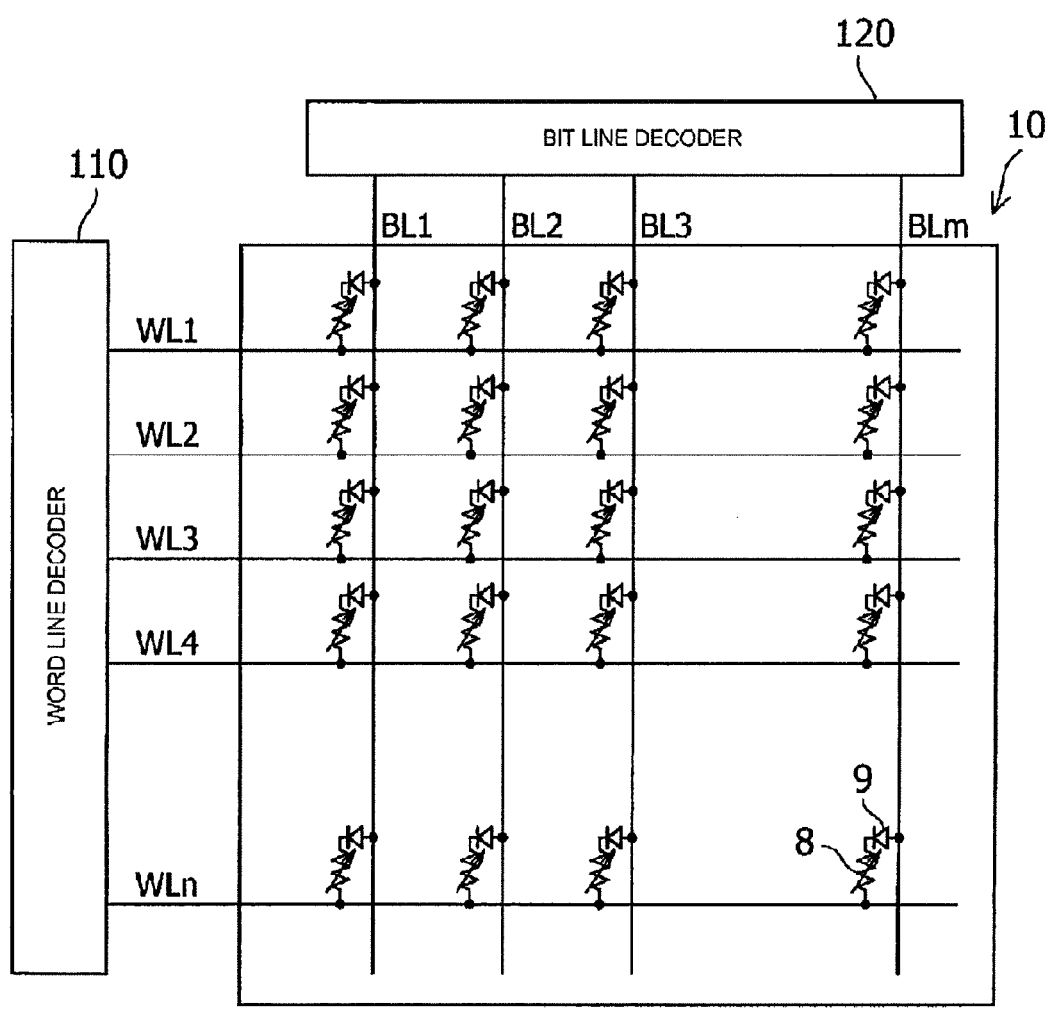
FIG. 10 is a schematic diagram showing a non-volatile semiconductor storage device including a cross-point type memory cell array formed by arraying memory cells.

FIG. 9 shows a memory cell 8 using the magnetoresistance elements 1 (1-1 and 1-2) shown in FIG. 1 and FIG. 6, and FIG. 10 shows a non-volatile semiconductor storage device 10 including a cross-point type memory cell array formed by arraying memory cells 8.

As already described, switching with a unipolar electrical pulse is possible with the magnetoresistance elements 1-1 and 1-2 of the invention. The memory cell 8 has a configuration wherein a rectifier element 9 (for example, a diode) acting as a selector switch is connected in series to the magnetoresistance element 1. Consequently, by disposing individual memory cells 8 in an array form, the cross-point type non-volatile semiconductor storage device 10 shown in FIG. 10 is formed.

With regard to the manufacture of the individual memory cells 8, for example, it is possible to form the rectifier element 9 in advance on the silicon substrate 15 (FIG. 1), and to form the magnetoresistance element 1 in a portion above the rectifier element 9. Then, by applying an electrical pulse with a positive polarity from the storage layer 20 or 200 (refer to FIG. 1 and FIG. 6) side of the magnetoresistance element 1 in the memory cell 8, it is possible to cause the memory cell 8 to carry out an efficient switching.

Meanwhile, a processing temperature appropriate for fabricating the magnetoresistance element 1 is in the region of, or less than, the 350° C. appropriate as an annealing temperature. Consequently, it does not happen that the performance of an electrical pulse supply transistor (for example, a MOSFET), or the cell selection switch rectifier element 9, formed in a portion below the magnetoresistance element 1 is impaired by the effect of the annealing temperature. It is also possible to increase the total memory capacity by stacking non-volatile semiconductor storage devices 10 three-dimensionally. In this case, the number of wires increases but, as the wire material can sufficiently withstand the annealing temperature of 350° C., there is no danger of the wires deteriorating because of the temperature.

Next, referring to FIG. 10, a more detailed description will be given of the non-volatile semiconductor storage device 10 having a configuration acting as a cross-point type memory cell array. When contents of information to be stored are written into the non-volatile semiconductor storage device 10, lines among word lines WLi (i=1 to n) corresponding to words accessed are selected by a word line decoder 110, and a signal corresponding to data to be written into the lines of memory cells 8 connected to the word lines selected is applied from a bit line decoder 120 via bit lines BLi (i=1 to m) to the corresponding memory cells 8. Word lines of words not accessed are affected by an action of the rectifier element (diode) 9 in such away that no current flows to the memory cells 8. That is, only word lines of words accessed are connected to a ground. Then, a signal such that a set action or reset action is realized is applied from the bit line decoder 120, in accordance with data needing to be written, between the bit lines and word lines connected to the accessed memory cells 8.

Next, a description will be given of a read action. The bit line decoder 120 includes current detection units (not shown) provided corresponding to each bit line. When reading, in the same way as when writing, accessed word lines are selected by the word line decoder 110, and current flowing from each bit line into the word lines is detected by the current detection units. Therefore, the bit line decoder 120 detects voltage values in accordance with the resistance of the memory cell 8 corresponding to each bit line, and reads the condition of the memory cells 8 based on the voltage values.

Heretofore, a description has been given of embodiments of the invention but, the invention not being limited to the embodiments already described, various kinds of alteration, change, and combination are possible based on the technological idea of the invention.

For example, in the first embodiment, the heat assist layer 28-1 is deposited on the storage layer 200 in FIG. 1, but this is not limiting. That is, provided that the heat assist layer 28-1 can heat the storage layer 200, it can be formed in any position in a magnetic tunnel junction portion 13. For example, the heat assist layer 28-1 may be interposed between the lower electrode 14 and pinned layer 22. The same also applies to the second embodiment.

It will be apparent to those skilled in the art that various modifications and variations can be made to the disclosed magnetoresistance element. Other embodiments will be apparent to those skilled in the art from consideration of the specification and practice of the disclosed magnetoresistance element. It is intended that the specification and examples be considered as exemplary only, with a true scope being indicated by the following claims.

The invention claimed is:

1. A magnetoresistance element comprising:
    a magnetic tunnel junction portion configured by sequentially stacking a perpendicularly magnetized first magnetic body, an insulation layer, and a perpendicularly magnetized second magnetic body; and
    a heat assist layer that heats the first magnetic body with heat generated based on a current flowing through the magnetic tunnel junction portion;
    the first magnetic body having a configuration wherein a ferromagnetic layer and a rare earth-transition metal alloy layer are stacked sequentially from the insulation layer side interface; and
    the magnetization direction of the first magnetic body being reversed by the heating of the first magnetic body.

2. The magnetoresistance element according to claim 1, wherein the heat assist layer is disposed on an interface on the side of the first magnetic body opposite to the insulation layer side interface.

3. The magnetoresistance element according to claim 2, wherein the heat assist layer is disposed either directly on the opposite side interface, or across an oxide protective layer.

4. The magnetoresistance element according to claim 1, wherein:
    the compensated temperature of the rare earth-transition metal alloy layer in the first magnetic body is room temperature to 350° C.;
    the resistivity of the heat assist layer is 0.01Ω cm to 10Ω cm; and
    the magnetization direction of the first magnetic body is switched to either of a low resistance condition or a high resistance condition by a unipolar electrical pulse.

5. The magnetoresistance element according to claim 1, wherein:
    the heat assist layer is a metal-insulator transition material wherein the resistivity of the heat assist layer is increased by two times or more when the transition temperature of the heat assist layer is exceeded; and
    the transition temperature is within a range from room temperature to the compensated temperature of the rare earth-transition metal alloy layer.

6. A magnetoresistance element comprising:
    a magnetic tunnel junction portion configured by sequentially stacking a perpendicularly magnetized first magnetic body, an insulation layer, and a perpendicularly magnetized second magnetic body; and
    a heat assist layer that heats the second magnetic body with a heat generated based on a current flowing through the magnetic tunnel junction portion;
    the second magnetic body having a configuration wherein a ferromagnetic layer and a rare earth-transition metal alloy layer are stacked sequentially from the insulation layer side interface; and
    the magnetization direction of the second magnetic body being reversed by the heating of the second magnetic body.

7. The magnetoresistance element according to claim 6, wherein the heat assist layer is disposed on an interface on the side of the second magnetic body opposite to the insulation layer side interface.

8. The magnetoresistance element according to claim 7, wherein the heat assist layer is disposed either directly on the opposite side interface, or across an oxide protective layer.

9. The magnetoresistance element according to claim 6, wherein:
- the compensated temperature of the rare earth-transition metal alloy layer in the second magnetic body is room temperature to 350° C.;
- the resistivity of the heat assist layer is 0.01Ω cm to 10Ω cm; and
- the magnetization direction of the second magnetic body is switched to either of a low resistance condition or a high resistance condition by a unipolar electrical pulse.

10. The magnetoresistance element according to claim 6, wherein:
- the temperature of the heat assist layer is within a range from room temperature to the transition temperature of the rare earth-transition metal alloy layer, and the temperature coefficient of resistance of the heat assist layer is positive; and
- the compensated temperature of the rare earth-transition metal alloy layer is room temperature or higher.

11. A non-volatile semiconductor storage device, comprising:
- the magnetoresistance element according to claim 6;
- a switching element connected in series to the magnetoresistance element;
- an information rewriting element that carries out a write and erase by causing a write current to flow through the magnetoresistance element; and
- a reading element that reads information stored from the amount of current flowing through the magnetoresistance element.

* * * * *